United States Patent
Zhuang et al.

(10) Patent No.: US 6,372,034 B1
(45) Date of Patent: Apr. 16, 2002

(54) PGO SOLUTIONS FOR THE PREPARATION OF PGO THIN FILMS VIA SPIN COATING

(75) Inventors: Wei-Wei Zhuang; Jer-shen Maa; Fengyan Zhang, all of Vancouver; Sheng Teng Hsu, Camas, all of WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 09/687,827

(22) Filed: Oct. 12, 2000

(51) Int. Cl.[7] .......................... H01L 21/22; H01G 4/10
(52) U.S. Cl. ........................ 106/287.19; 438/3
(58) Field of Search .................. 106/287.19; 438/3

(56) References Cited

U.S. PATENT DOCUMENTS 5,204,314 A    4/1993   Kirlin et al.
6,242,771 B1 * 6/2001   Hsu et al. .................... 257/295

FOREIGN PATENT DOCUMENTS

JP    8-186058    *  7/1996  ............ H01G/4/30

OTHER PUBLICATIONS

Caplus 1995:979275, Friedrich et al, "Effect of Structure and chemical modificaton of precursors . . . ", 1993 (Abstract).*
Caplus 1988:225702, Dekleva et al, "Sol–gel processing of lead titanate in 2–methoxyethanol . . . ", 1988 (Abstract).*
Iwasaki et al., Applied Physics Letters, 18, 444 (1971) No month provided.
Iwasaki et al., Applied Physics Letters, 43, 4907 (1972) No month provided.
A. Mansingh et al., J. Appl. Phys. 51, 5408 (1980) No month provided.
H. Schmitt et al., Ferroelectrics 56, 142 (1984) No month provided.
Krupanidhi et al., Proceedings of the 3d International Symposium on Integrated Ferroelectrics, 100 (1991). No month provided.
C. J. Peng et al., appl. Phys. Lett. 60, 827 (1992) No month provided.
J. J. Lee et al., Appl. Phys. Lett. 60, 827 (1992) No month provided.

* cited by examiner

*Primary Examiner*—David Brunsman
(74) *Attorney, Agent, or Firm*—David C. Ripma; Matthew D. Rabdau; Scott C. Krieger

(57) ABSTRACT

A method of preparing a PGO solution for spin coating includes preparing a 2-methoxyethanol organic solvent; adding $Pb(OCH_3CO)_2 \cdot 3H_2O$ to the organic solvent at ambient temperature and pressure in a nitrogen-filled glaved box to form Pb in methoxyethanol; refluxing the solution in a nitrogen atmosphere at 150° C. for at least two hours; fractionally distilling the refluxed solution at approximately 150° C. to remove all of the water from the solution; cooling the solution to room temperature; determining the Pb concentration of the solution; adding the 2-methoxyethanol solution to the Pb 2-methoxyethanol until a desired Pb concentration is achieved; combining $Ge(OR)_4$, where R is taken the group of Rs consisting of $CH_2CH_3$ and $CH(CH_3)_2$, and 2-methoxyethanol; and adding $Ge(OR)_4$ 2-methoxyethanol to PbO 2-methoxyethanol to form the PGO solution having a predetermined metal ion concentration and a predetermined Pb:Ge molar ration.

4 Claims, 1 Drawing Sheet

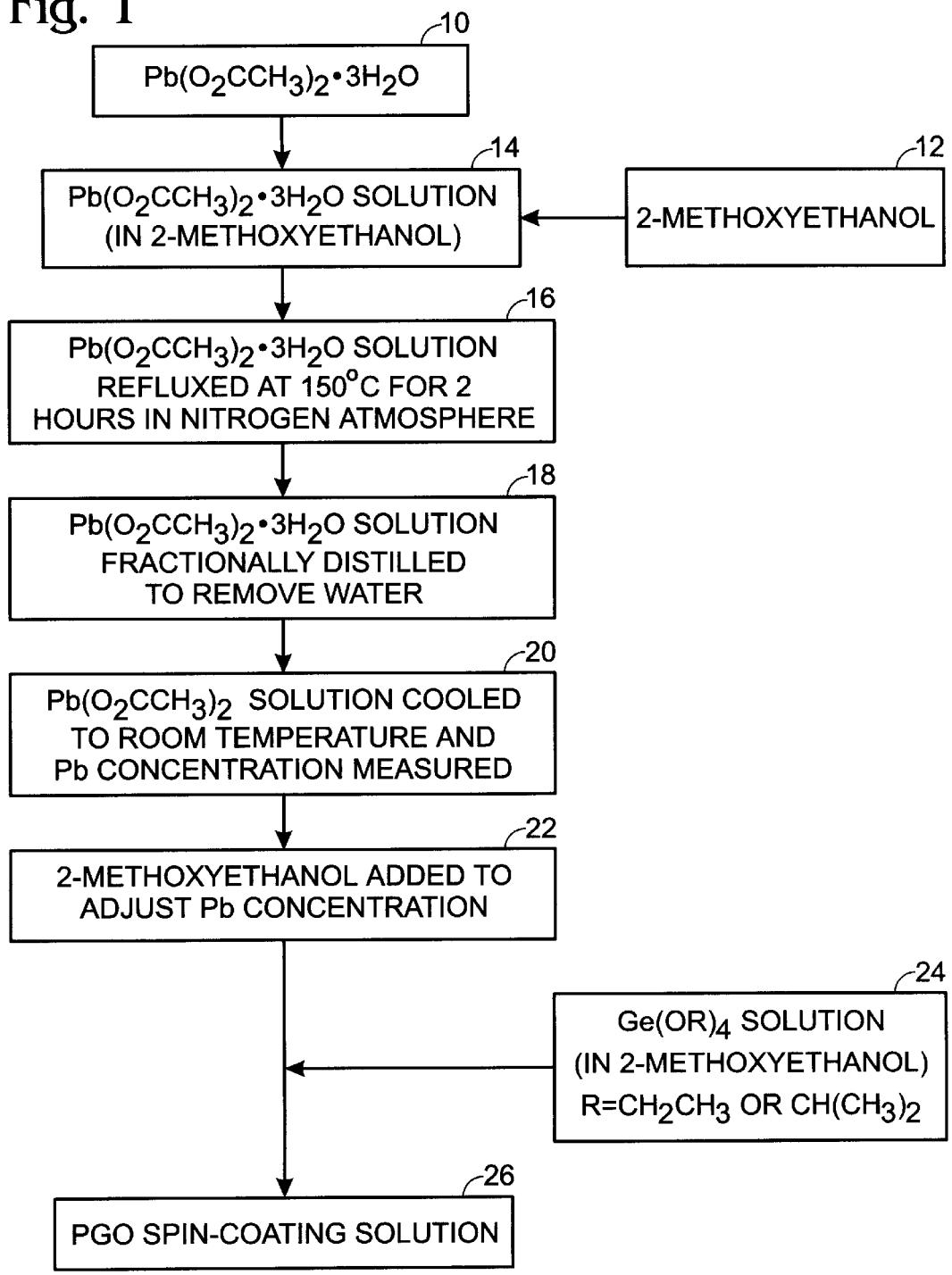

PGO SOLUTIONS FOR THE PREPARATION OF PGO THIN FILMS VIA SPIN COATING

RELATED APPLICATION

This Application is related to Ser. No. 09/489,857, filed Jan. 24, 2000, for A METHOD AND SYSTEM FOR METALORGANIC CHEMICAL VAPOR DEPOSITION (MOCVD) AND ANNEALING OF LEAD GERMANITE (PGO) THIN FILMS.

FIELD OF THE INVENTION

The present invention relates to lead germanium oxide (PGO) thin film materials, and particularly to the spin-coating of PGO ferroelectric thin films in one-transistor applications.

BACKGROUND OF THE INVENTION

Ferroelectric films have attracted great interest in recent years because of their applications in electro-optic, pyroelectric, frequency agile electronic and non-volatile memory devices. The fabrication and characterization of ferroelectric lead germanium oxide thin films (PGO), such as $Pb_5Ge_3O_{11}$ and $Pb_3GeO_5$, are of current interest. Lead germanite ($Pb_5Ge_3O_{11}$) is a relative new member of ferroelectric family. The piezoelectric, dielectric and electric-optic properties of single crystal and polycrystalline materials have been reported in the literature. $Pb_5Ge_3O_{11}$ is an optically active and ferroelectric material, has a moderate dielectric constant and a small remanent polarization, which make it particularly suitable for ferroelectric non-volatile memory devices such as metal ferroelectric metal oxide silicon (MFMOS), metal ferroelectric metal silicon (MFMS), metal ferroelectric insulators silicon (MFIS), metal-insulator-ferroelectric-silicon (MIPS), metal-insulator ferroelectric insulators silicon (MIFIS), and metal-ferroelectric-silicon (MFS) type memories. $Pb_5Ge_3O_{11}$ also has potential in thermal detector applications because of its pyroelectric and dielectric characteristics. $Pb_3GeO_5$ is a ferroelastic material, which may be used for microelectromechanical systems (MEMS) applications.

Chemical vapor deposition (CVD) is a particularly attractive method for semiconductor industries because it is readily scaled up to production runs and provides very good step coverage. For PGO ($Pb_5Ge_3O_{11}$ and $Pb_3GeO_5$) films, the content of lead to germanium is very high, i.e., 5:3 and 3:1, respectively. Because of Pb loss in the thermal MOCVD process, an excess Pb concentration and a high oxygen partial pressure must be used to make stoichiometric PGO thin films and avoid the Pb and O deficiency.

The Pb precursors for MOCVD PGO film are liquids or solids that can be sublimed into a gas phase and transported into a reactor. The process window of Pb precursors is very narrow, i.e., the sublimation temperature of the Pb precursors is close to the decomposition and condensation temperature, in which case the reagent may begin to decompose or condense in the reactant lines before reaching the reactor, making it very difficult to control the stoichiometry of the deposited films. The Pb precursor gas easily reacts with oxygen in the gas phase before deposition, which results in large particles and a cloudy film, especially at higher deposition temperatures.

Because of some of the problems associated with MOCVD and known spin coating processes of PGO thin films, other solutions and techniques may be more suitable for deposition of this material in integrated circuit devices by spin coating. There has been some discussion of PGO material suitable for spin coating and of the spin coating process in Kim et al., *Japanese Journal of Applied Physics* 33, pp 2675–2678, 1994; and Lee et al., *Applied Physics Letters* 60, pp 2487–2488, May 18, 1992.

Known techniques for spin coating PGO films are similar to those used for PZT ferroelectric thin films wherein $Pb(OCH_3CO)_2.3H_2O$ is used as the Pb source and $Ge(OCH_2CH_3)_4$ is used as the Ge source. The Ge source, however, is air and moisture sensitive, and as the Pb source contains water, a PGO solution formed in this manner will be unstable, and a Ge gel will generally precipitate from the solution.

SUMMARY OF THE INVENTION

A method of preparing a PGO solution for spin coating includes preparing a 2-methoxyethanol organic solvent; adding $Pb(OCH_3CO)_2.3H_2O$ to the organic solvent at ambient temperature and pressure in a nitrogen-filled gloved box to form Pb in methoxyethanol; refluxing the solution in a nitrogen atmosphere at 150° C. for at least two hours; fractionally distilling the refluxed solution at approximately 150° C. to remove all of the water from the solution; cooling the solution to room temperature; determining the Pb concentration of the solution; adding the 2-methoxyethanol solution to the Pb 2-methoxyethanol until a desired Pb concentration is achieved; combining $Ge(OR)_4$, where R is taken from the group of Rs consisting of $CH_2CH_3$ and $CH(CH_3)_2$, and 2-methoxyethanol; and adding $Ge(OR)_4$ 2-methoxyethanol to PbO 2-methoxyethanol to form the PGO solution having a predetermined metal ion concentration and a predetermined Pb:Ge molar ratio.

An object of the invention is to provide a PGO solution suitable for spin coating application.

Another object of the invention is to provide a techniques for spin coating a PGO film in a one-transistor application.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWING

FIG. 1 is a block diagram of preparation of a PGO solution according to the invention.

DETAILED DESCRIPTION OF THE PREFERRED EMBODIMENT

Lead-Germanium oxide (PGO) has received some use as ferroelectric material, however, such films have not been adapted to use in the single transistor area. Very little information is available regarding PGO ferroelectric thin films suitable for deposition by spin coating. As previously noted, Ge tends to precipitate from solution as a gel. The solutions used in the practice of this invention prevent such precipitation.

In the preferred embodiment, water is removed from $Pb(OCH_3CO)_2.3H_2O$, thereby forming an anhydrous PGO solution using $Ge(OCH_2CH_3)_4$ or $Ge(OCH(CH_3)_2)_4$ {Ge $(OR)_4$} as Ge source. The water component of $Pb(OCH_3CO)_2.3H_2O$ is removed by refluxing and fractional distillation over 2-methoxyethanol. A clear solution, without any precipitated PGO is obtained, which solution is stable for at least one month, which is sufficient time to use the solution in PGO spin coat applications.

Preparation of the PGO solution, and now referring to FIG. 1, is as follows: $Pb(OCH_3CO)_2 \cdot 3H_2O$, block 10, is added to 2-methoxyethanol organic solvent, block 12, at ambient temperature and pressure in a nitrogen-filled gloved box to form Pb in methoxyethanol, block 14. Pb concentration at this point is in the range of about 0.3 mol/L to 0.6 mol/L. The solution is refluxed in a nitrogen atmosphere at 150° C. for at least two hours, block 16. After refluxing, the solution is fractionally distilled at approximately 150° C. to remove all of the water from the solution, block 18. The solution is cooled to room temperature, after which the Pb concentration may be measured by chemical analysis on Pb titration, block 20. Pb concentration at this stage of the process will be in the range of about 0.35 mol/L to 0.65 mol/L.

$Ge(OR)_4$ is mixed with 2-methoxyethanol, and 2-methoxyethanol is added into the Pb 2-methoxyethanol until a desired Pb concentration is achieved, block 22. The desired Pb concentration range is 0.3 mol/L to 0.5 mol/L. The $Ge(OR)_4$ 2-methoxyethanol solution, block 24, is introduced into the Pb 2-methoxyethanol solution until the concentrations of Pb and Ge form a molar ratio of 5 to 5.5:3 and the metal (Pb) ion concentration is in the range of 0.1 mol/L to 0.4 mol/L, -thereby providing the PGO solution, suitable for spin coating, block 26.

Thus, a method for the preparation of a PGO solution suitable for the formation of thin films via spin coating has been disclosed. It will be appreciated that further variations and modifications thereof may be made within the scope of the invention as defined in the appended claims.

We claim:

1. A method of preparing a PGO solution for spin coating, comprising:

preparing a 2-methoxyethanol organic solvent;

adding $Pb(OCH_3CO)_2 \cdot 3H_2O$ to the organic solvent at ambient temperature and pressure in a nitrogen-filled gloved box to form Pb in methoxyethanol;

refluxing the solution in a nitrogen atmosphere at 150° C. for at least two hours;

fractionally distilling the refluxed solution at approximately 150° C. to remove all of the water from the solution;

cooling the solution to room temperature;

determining the Pb concentration of the solution;

adding the 2-methoxyethanol solution to the Pb 2-methoxyethanol until a desired Pb concentration is achieved;

combining $Ge(OR)_4$, where R is taken from the group of Rs consisting of $CH_2CH_3$ and $CH(CH_3)_2$, and 2-methoxyethanol; and adding $Ge(OR)_4$ 2-methoxyethanol to PbO 2-methoxyethanol to form the PGO solution having a predetermined metal ion concentration and a predetermined Pb:Ge molar ratio.

2. The method of claim 1 wherein the predetermined Pb concentration range is 0.35 mol/L to 0.65 mol/L.

3. The method fo claim 1 wherein the predetermined Pb:Ge molar ration in the range of about 5 to 5.5:3.

4. A method of preparing a PGO solution for spin coating, comprising:

preparing a 2-methoxyethanol organic solvent;

adding $Pb(OCH_3CO)_2 \cdot 3H_2O$ to the organic solvent at ambient temperature and pressure in a nitrogen-filled gloved box to form Pb in methoxyethanol;

refluxing the solution in a nitrogen atmosphere at 150° C. for at least two hours;

fractionally distilling the refluxed solution at approximately 150° C. to remove all of the water from the solution;

cooling the solution to room temperature;

determining the Pb concentration of the solution;

adding the 2-methoxyethanol solution to the Pb 2-methoxyethanol until a desired Pb concentration is achieved;

combining $Ge(OR)_4$, where R is taken from the group of Rs consisting of $CH_2CH_3$ and $CH(CH_3)_2$, and 2-methoxyethanol; and adding $Ge(OR)_4$ 2-methoxyethanol to PbO 2-methoxyethanol to form the PGO solution having a predetermined metal ion concentration in a range of about 0.35 mol/L to 0.65 mol/L and a predetermined Pb:Ge molar ratio in a range of about 5 to 5.5:3.

\* \* \* \* \*